United States Patent [19]

Arimoto et al.

[11] Patent Number: 4,860,070

[45] Date of Patent: Aug. 22, 1989

[54] SEMICONDUCTOR MEMORY DEVICE COMPRISING TRENCH MEMORY CELLS

[75] Inventors: Kazutami Arimoto; Kiyohiro Furutani, both of Hyogo, Japan

[73] Assignee: Mitsubishi Denki Kabushiki Kaisha, Tokyo, Japan

[21] Appl. No.: 131,635

[22] Filed: Dec. 11, 1987

[30] Foreign Application Priority Data

Jan. 9, 1987 [JP] Japan .................................. 62-3614
Apr. 14, 1987 [JP] Japan ................................ 62-92708

[51] Int. Cl.$^4$ .................... H01L 29/78; H01L 29/06; H01L 27/12; H01L 27/02
[52] U.S. Cl. .................................. 357/23.6; 357/55; 357/49; 357/41
[58] Field of Search .................... 357/23.6, 55, 49, 41

[56] References Cited

U.S. PATENT DOCUMENTS

| 4,017,885 | 4/1977 | Kendall et al. | 357/23.6 |
| 4,577,395 | 3/1986 | Shibata | 357/23.6 |

FOREIGN PATENT DOCUMENTS

| 56442 | 3/1986 | Japan | 357/23.6 |
| 234067 | 10/1986 | Japan | 357/23.6 |

OTHER PUBLICATIONS

Mashiko et al., "A 4-Mbit DRAM with Folded-Bit-Line Adaptive Sidewall-Isolated Capacitor (FASIC) Cell," IEEE Journal of Solid-State Circuits, vol. SC-22, No. 5, Oct. 1987, pp. 643-650.

Elahy, M. et al., "Trench Capacitor Leakage in MBIT DRAMS", IEDM 84, 9.6, pp. 248-251.

*Primary Examiner*—Rolf Hille
*Assistant Examiner*—Robert P. Limanek
*Attorney, Agent, or Firm*—Lowe, Price, Leblanc, Becker & Shur

[57] ABSTRACT

A plurality of memory cells are arranged spaced apart from each other on the surface of a semiconductor substrate. Cell trenches are formed corresponding to the memory cells on the semiconductor substrate. An isolation trench formed to be integral with the cell trenches is formed in a region between each of the cell trenches in each of memory cells and the cell trench in the adjacent memory cell. Charge storage regions are formed in the bottom surface portions and the side surface portions of the cell trenches, and isolation oxide films are formed in the bottom surface portion and the side surface portion of the isolation trench.

10 Claims, 4 Drawing Sheets

SEMICONDUCTOR MEMORY DEVICE COMPRISING TRENCH MEMORY CELLS

BACKGROUND OF THE INVENTION

1. Field of the Invention

The present invention relates to an MOS (Metal Oxide Semiconductor) dynamic RAM (Random Access Memory) comprising a plurality of trench memory cells.

2. Description of the Prior Art

A random access memory (RAM) comprises a memory cell array having a plurality of memory cells arranged in a matrix and selecting means for selecting a single memory cell from the memory cell array, information being written into a memory cell selected by the selecting means or information stored in the memory cell selected by the selecting means being read out.

FIG. 1 is a diagram showing an example of an equivalent circuit of a dynamic type memory cell.

In FIG. 1, charges are stored in a capacitor 13 from a bit line 11 through an MOS transistor 12, and information is stored depending on the presence or absence of the charges. When a predetermined potential is applied to a word line 14, the MOS transistor 12 is rendered conductive. As a result, information can be written or read out. Each of the above described memory cells comprises an MOS transistor and a charge storage region (capacitor) formed on a semiconductor substrate. Recently, a trench memory cell in which a trench is formed on a semiconductor substrate and a charge storage region is formed in the inner surface of the trench has been developed for high integration of a semiconductor memory device.

FIG. 2A is a plan view showing an MOS Dynamic RAM comprising conventional trench memory cells (trench type memory cells) arranged for a folded bit line system, and FIG. 2B is a cross sectional view taken along a line II—II shown in FIG. 2A.

The trench memory cells are proposed in, for example, Lecture Number 9.6 in International Electron Device Meeting in 1984 (IEDM'84).

In FIGS. 2A and 2B, a pluraliy of memory cells 2 are formed in the surface of a p type semiconductor substrate 1, and isolating oxide films 3 are formed between the memory cells 2. Each of the memory cells 2 comprises a charge storage region 4 for storing charges, a transfer gate region 5, and an n type impurity diffusion region 6 connected to a bit line 7. The above described charge storage region 4 is provided in a trench 8 (a region enclosed by a thick solid line in FIG. 2A) formed in the surface of the semiconductor substrate 1, and comprises an n+ layer 41, an insulating film 42 for a capacitor, and a cell plate 43. The n+ layer 41 is formed in the bottom surface portion and the side surface portion of the trench 8 for a cell, and the cell plate 43 comprising polysilicon is formed in the upper portion of the n+ layer 41 through the insulating film 42 for a capacitor. As a result, charges are stored in the n+ layer 41. The transfer gate region 5 comprises a channel region 51 between the impurity diffusion layer 6 and the n+ layer 41 in the trench 8 for a cell, and a word line 9 comprising polysilicon formed in the channel region 51. The impurity diffusion region 6, the transfer gate region 5, and the n+ layer 41 in the charge storage region 4 constitute a switching transistor. When a predetermined potential is applied to the word line 9, an inversion layer is formed in the channel region 51, and information stored in the bit line 7 is transferred to the charge storage region 4 through the channel region 51.

Therefore, when charge storage capacitance (capacitance between the n+ layer 41 and the cell plate 43) is provided in the trench 8, large charge storage capacitance can be obtained with the reduced area, and integration is increased. In addition, an MOS dynamic RAM having large capacitance which is immune to soft errors such as alpha-particles, the other noise or the like can be achieved.

In the MOS dynamic RAM comprising the above described conventional trench memory cells, the p type semiconductor substrate 1 is generally set to a negative potential (about $-3$ V), and a potential of about 5 V or about 0 V corresponding to information "1" or "0" is applied to the n+ layer 41 serving as a charge storage node.

FIG. 3 is an enlarged cross sectional view showing trenches in the adjacent two memory cells shown in FIG. 2B.

In FIG. 3, when for example, the potential of an n+ layer 41a in a trench 8a in one memory cell 2a becomes 0 V and the potential of an n+ layer 41b in a trench 8b in the other memory cell 2b becomes 5 V, depletion regions 10a and 10b are formed on the side of the semiconductor substrate 1 on the n+ layer 41a and the n+ layer 41b.

Thus, if the adjacent trenches 8a and 8b are formed to be closer to each other, the above described depletion region 10a and 10b contact with each other, so that punch-through occurs between the memory cells 2a and 2b.

Therefore, intervals a and b (see FIG. 2A) between adjacent trenches 8a and 8b can not be decreased, which presents a large problem in providing high integration.

To avoid this, some methods are proposed. For example, trench memory cells may be formed in a p well having a high concentration so that expansion of the depletion region 10a and 10b is controlled. Alternatively, an epitaxial substrate may be used. However, the well having a high concentration reduces the breakdown voltage of memory cells and a semiconductor substrate. Furthermore, the epitaxial substrate is expensive.

SUMMARY OF THE INVENTION

A primary object of the present invention is to provide a structure of a semiconductor memory device in which punch-through between trench memory cells is prevented without increasing an impurity concentration of a semiconductor substrate and without using an epitaxial substrate, so that high integration becomes possible.

In order to attain the above described object, a semiconductor memory device according to the present invention has a plurality of memory cells arranged spaced apart from each other, and comprises a semiconductor substrate, the semiconductor substrate having a plurality of trenches for cell (referred to as "cell trench" hereinafter) provided corresponding to the plurality of memory cells and trenches for isolation (referred to as "isolation trench" hereinafter) formed to be integral with the cell trenches in a region between adjacent memory cells, charge storage regions each formed in the inner surface of each of the cell trenches, and isolation regions each formed in the inner surface of each of the isolation trenches.

In accordance with the preferred embodiment of the present invention, each cell trench comprises a plurality of trenches.

In the semiconductor memory device according to the present invention, an isolation trench which is integral with adjacent cell trenches is formed in an isolation region between the cell trenches of adjacent memory cells. Charge storage regions formed in the adjacent cell trenches are isolated from each other by an insulating film formed in the above described isolation trench. More specifically, charge storage regions formed in the bottom surface portions of the adjacent trenches are isolated from each other by an insulating film formed in the bottom surface portion of the isolation trench which is formed integrally with the adjacent cell trenches. In addition, charge storage regions formed in the side surface portions of the adjacent trenches are isolated from each other by an insulating film formed in the side surface portion of the isolation trench which are formed integrally with the cell trenches.

Since both the charge storage regions formed in the bottom surface portions of the adjacent trenches are on the same plane and both the charge storage regions formed in the side surface portions of the adjacent trenches are on the same plane, depletion regions formed on the side of the semiconductor substrate in the charge storage regions are on the same plane. Thus, even if an interval between adjacent trenches is decreased, punch-through never occurs.

Therefore, an advantage of the semiconductor memory device according to the present invention is that punch-through between adjacent memory cells is prevented without increasing an impurity concentration of a substrate and without using an epitaxial substrate, so that high integration becomes possible and the reliability is improved.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
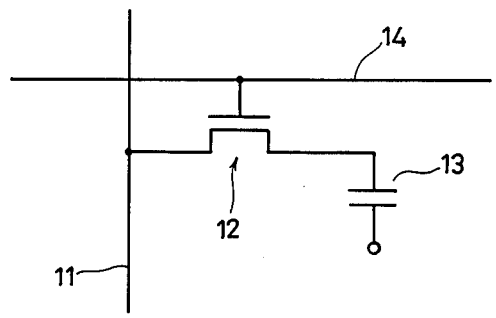
FIG. 1 is a diagram showing an equivalent circuit of a memory cell in an MOS dynamic random access memory.
Figure 3:
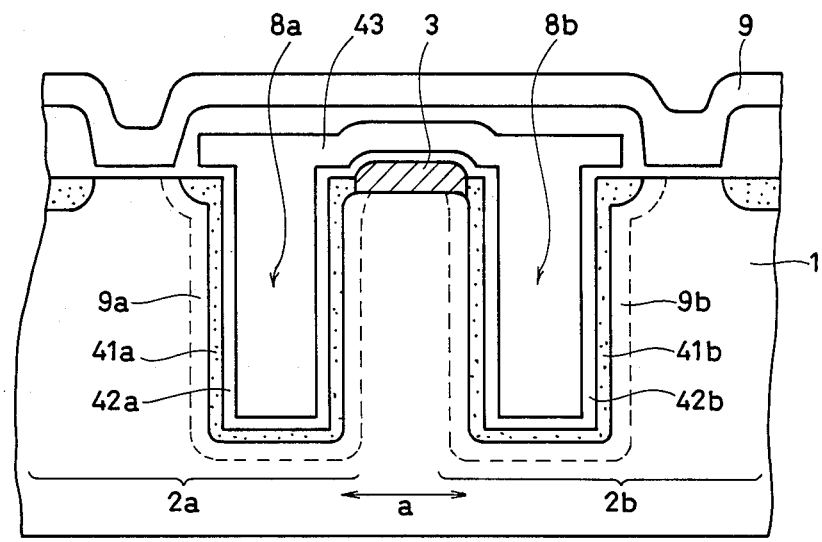
FIG. 3 is an enlarged cross sectional view showing memory cells for explaining a punch-through phenomenon in the conventional semiconductor memory device.
Figure 2A:
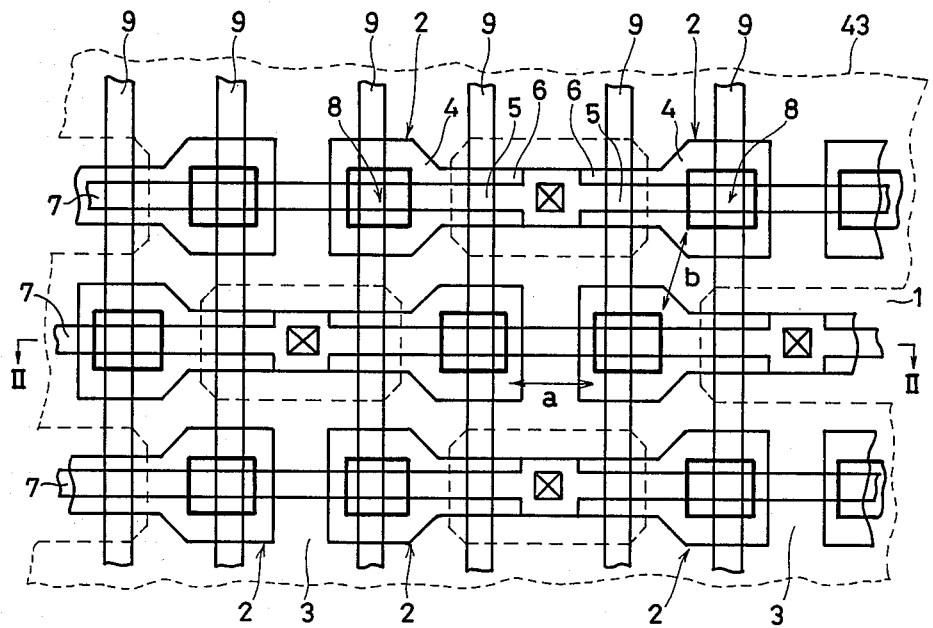
FIG. 2A is a plan view showing a conventional semiconductor memory device, where an arrangement of a plurality of trench memory cells is illustrated.
Figure 2B:
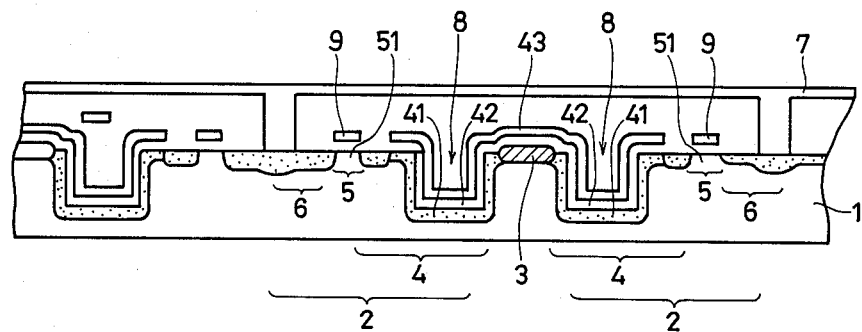
FIG. 2B is a cross sectional view taken along a line II—II of the semiconductor memory device shown in FIG. 2A.
Figure 4A:
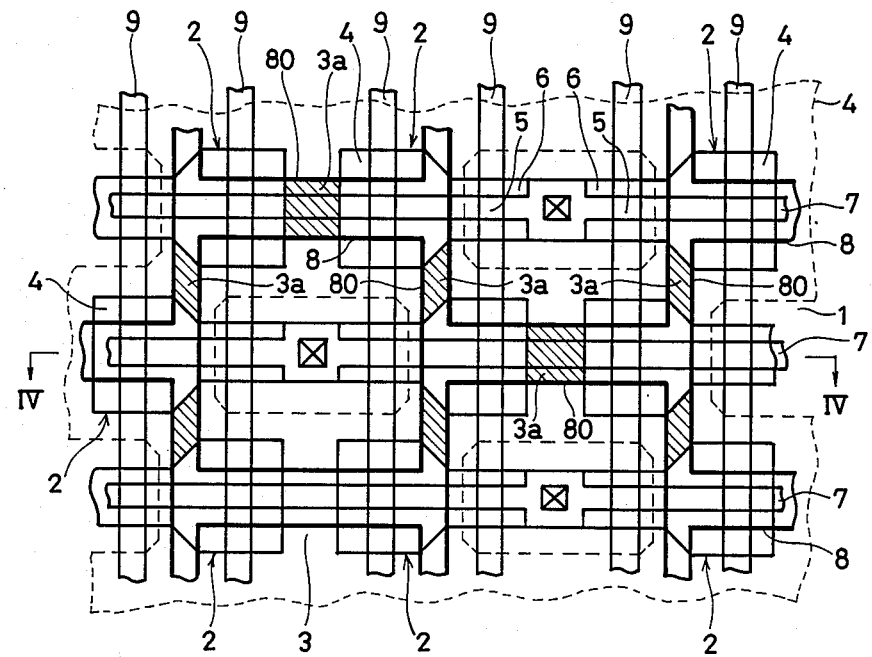
FIG. 4A is a plan view showing a semiconductor memory devive according to an embodiment of the present invention, where an arrangement of a plurality of trench memory cells and trenches are illustrated.
Figure 4B:
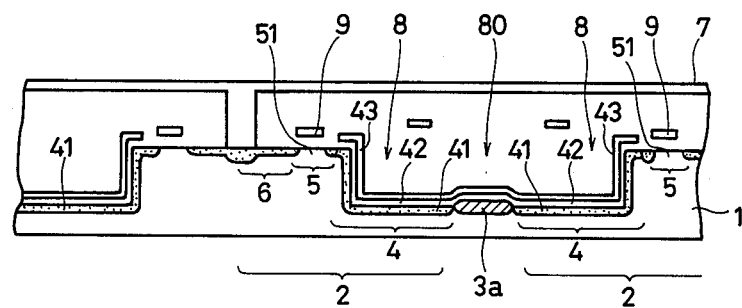
FIG. 4B is a cross sectional view taken along a line IV—IV of the semiconductor memory device shown in FIG. 4A.

FIGS. 4A and 4B are a plan view and a cross sectional view, respectively, showing a semiconductor memory device according to an embodiment of the present invention. The semiconductor memory device is an MOS dynamic RAM comprising a plurality of trench memory cells arranged for a folded bit line system. Referring now to FIGS. 4A and 4B, description is made on a structure of the semiconductor memory device.

In FIGS. 4A and 4B, a plurality of memory cells 2 are formed on the surface of a p type semiconductor substrate 1, and isolating oxide films 3 are formed between the memory cells 2. Each of the memory cells 2 comprises a charge storage region 4, a transfer gate region 5 and an n type impurity diffusion region 6 connected to a bit line. The charge storage region 4 is formed in a cell trench 8 formed in the surface of the semiconductor substrate 1, and comprises an $n^+$ layer 41, an insulating film 42 for a capacitor and a cell plate 43. The $n^+$ layer 41 is formed in the bottom surface portion and the side surface portion of the cell trench 8. Charges are stored in the $n^+$ layer 41. The cell plate 43 comprising polysilicon is formed in the upper portion of the above described $n^+$ layer 41 through the insulating film 42 for a capacitor. The transfer gate region 5 comprises a channel region 51 between the impurity diffusion region 6 and the $n^+$ layer 41 in the cell trench 8, and a word line 9 comprising polysilicon formed on the channel region 51. The impurity diffusion region 6, the transfer gate region 5, and the $n^+$ layer 41 in the charge storage region 4 consitute a switching transistor. When a predetermined potential is applied to the word line 9, and inversion layer is formed in the above described channel region 51, so that information stored in the bit line 7 is transferred to the above described charge storage region 4 through the channel region 51.

An isolation trench 80 is formed between a trench 8 in a memory cell 2 and a trench 8 in the adjacent memory cell 2. The cell trenches 8 in the adjacent memory cells 2 are integral with each other by the isolation trench 80. In FIG. 4A, regions represented by thick solid lines denote trenches. As a result, the trenches 8 and 80 as shown are reticularly formed in the surface of the semiconductor substrate 1 as a whole and shall be characterized herein as a "staggered reticular" trench pattern.

Isolating oxide films 3a are formed in the bottom surface portion and the side surface portion (not seen from FIG. 4B) of the isolation trench 80.

Regions represented by hatching in FIG. 4A correspond to isolation regions having the isolating oxide films 3a formed.

The $n^+$ layer 41 in the cell trench 8 in each of the memory cells 2 is completely isolated from the $n^+$ layer 41 in the cell trench 8 in the adjacent memory cell 2 by the insulating film 3a in the isolation trench 80 which is integral with the trench 8. More specifically, as shown in FIG. 4B, the $n^+$ layers 41 formed in the bottom surface portions in the adjacent cell trenches 8 are isolated from each other by the insulating oxide film 3a formed in the bottom surface portion of the isolation trench 80 which is integral with the staggered reticular cell trenches 8. In the same manner, the n+ layers 41 formed in the side surface portions in the adjacent cell trenches 8 are isolated from each other by the insulating oxide film 3a formed in the side surface portion in the isolation trench 80 which is integral with the cell trenches 8.

Thus, since the n+ layers 41 formed in the bottom surface portions in the adjacent cell trenches 8 are on the same plane and the n+ layers 41 formed in the side surface portions in the adjacent cell trenches 8 are on the same surface, depletion regions formed on the side of the semiconductor substrate 1 on the n+ layers 41 are on the same plane. Therefore, even if an interval between the adjacent cell trenches 8 is decreased, punch-through never occurs. In addition, since a well having a high concentration need not be provided and an epitaxial substrate need not be used, decrease in breakdown voltage can be avoided. As a result, high integration of the semiconductor memory device is provided.

Figure 5A:
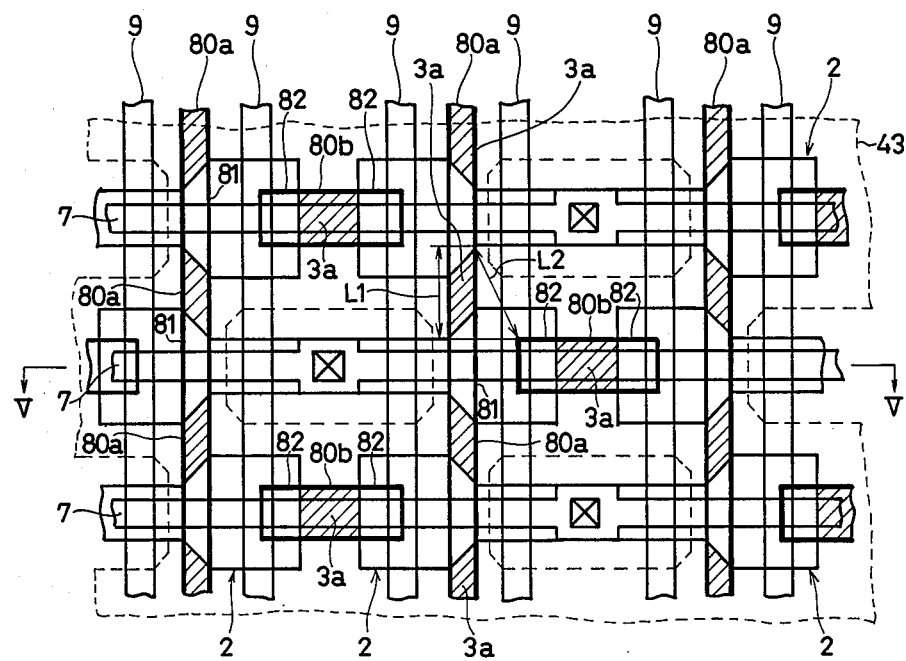
FIG. 5A is a plan view showing a semiconductor memory device according to another embodiment of the present invention, where an arrangement of a plurality of trench memory cells and trenches are illustrated.
Figure 5B:
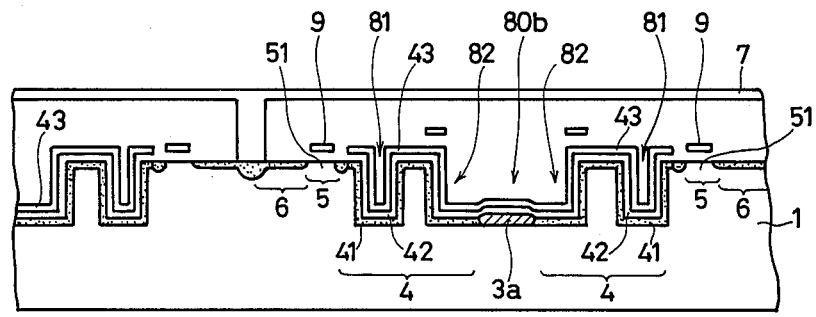
FIG. 5B is a cross sectional view taken along a line V—V of the semiconductor memory device shown in FIG. 5A.

FIGS. 5A and 5B are a plan view and a cross sectional view, respectively, showing a semiconductor memory device according to another embodiment of the present invention.

Structures of portions in the present embodiment are the same as those in the embodiment shown in FIGS. 4A and 4B, except for a structure of a cell trench in each memory cell.

In FIGS. 5A and 5B, a cell trench 8 provided for each memory cell 2 comprises a first trench 81 and a second trench 82. The first trench 81 is integral with the adjacent first trench 81 in a direction parallel with word lines 9 by an isolation trench 80a. A plurality of first trenches 81 are formed integrally in a direction parallel with the word lines 9 by the isolation trench 80a. Furthermore, the second trench 82 is integral with the adjacent second trench 82 in a direction parallel with bit lines 7 by an isolation trench 80b. Charge storage regions 4 each comprising an n+ layer 41, an insulating film 42 for a capacitor and a cell plate 43 are formed in the bottom surface portions and the side surface portions of the first trench 81 and the second trench 82, and in a region between the first trench 81 and the second trench 82. In addition, isolating oxide films 3a are formed in the bottom surface portions and the side surface portions of the isolation trenches 80a and 80b by selective oxidation. Regions represented by hatching in FIG. 5A correspond to isolation regions having the isolating oxide films 3a formed.

Also in the present embodiment, the n+ layer 41 in the cell trenches 81 and 82 in the memory cells 2 is completely isolated from the n+ layer 41 in the cell trenches 81 and 82 in the adjacent memory cells 2 by the isolating oxide films 3a in the isolation trenches 80a and 80b which are integral with the trenches 81 and 82. Thus, similarly to the embodiment shown in FIGS. 4A and 4B, even if an interval between adjacent cell trenches is decreased, punch-through never occurs.

Additionally, according to the present embodiment, since a cell trench comprises the independent first trench 81 and second trench 82 which are not integral with each other, the area of the charge storage region 4 is increased, so that large charge storage capacitance can be ensured.

In the conventional semiconductor memory device having a single trench for each memory cell, a distance at which punch-through may occur is represented by L1 shown in FIG. 5A. According to the present embodiment, since a cell trench is divided into the first trench 81 and the second trench 82, a distance at which punch-through may occur is represented by L2, which is longer than the above described distance L1. Thus, it is effective from the point of view of preventing a punch-through phenomenon to divide the cell trench into the two trenches 81 and 82.

Although in the above described embodiment, memory cells are arranged for a folded bit line system, the present invention can be applied to a semiconductor memory device of an open bit line system, in which case the same effect as the above described embodiment can be obtained.

Although the present invention has been described and illustrated in detail, it is clearly understood that the same is by way of illustrated and example only and is not to be taken by way of limitation, the spirit and scope of the present invention being limited only by the terms of the appended claims.

What is claimed is:

1. A semiconductor memory device comprising:
   a semiconductor substrate,
   a plurality of word lines arranged on said semiconductor substrate,
   a plurality of bit lines arranged to intersect with said word lines,
   memory cells arranged at intersections of said word lines and said bit lines,
   said semiconductor substrate having cell trenches each formed in a region of each of said memory cells, a first isolation trench which is formed integrally with said cell trenches in adjacent memory cells in a direction parallel with said word lines, and a second isolation trench which is formed integrally with said cell trenches in adjacent memory cells in a direction parallel with said bit lines,
   each of said memory cells comprising a charge storage region formed in the inner surface of each of said cell trenches, and a switching transistor region provided between each of said bit lines and each of said charge storage regions, said switching transistor region utilizing a part of said word lines as a gate electrode, and
   isolation regions formed in the inner surfaces of said first and second isolation trenches;
   only portions of the bottom surface of said first isolation trench, between diagonally adjacent ones of said memory cells, containing said isolation regions.

2. A semiconductor memory device in accordance with claim 1, wherein
   each of said isolation regions comprises an insulating film.

3. A semiconductor memory device in accordance with claim 1, wherein
   each of said charge storage regions comprises an impurity diffusion layer, an insulating film formed on said impurity diffusion layer and a cell plate formed on said insulating film.

4. A semiconductor memory device comprising:
   a semiconductor substrate,
   a plurality of word lines arranged on said semiconductor substrate,
   a plurality of bit lines arranged to intersect with said word lines,
   memory cells arranged at intersections of said word lines and said bit lines, said semiconductor substrate having cell trenches each formed in a region of each of said memory cells, each of said cell trenches comprising a first trench and a second trench, a first isolation trench which is formed integrally with adjacent cell trenches in a direction parallel with said lines, and a second isolation trench which is formed integrally with said adjacent cell trenches in a direction parallel with said bit lines, each of said memory cells comprising a charge storage region formed on the inner surface of each of said cell trenches, and a switching transistor region provided between each of said bit lines and each of said charge storage regions, said switching transistor region utilizing a part of said word lines as a gate electrode, and isolation regions formed in the inner surfaces of said isolation trenches;

only portions of the bottom surfaces of said isolation trenches, parallel to said word line between diagonally adjacent ones of said memory cells, containing said isolation regions.

5. A semiconductor memory device in accordance with claim 4, wherein
each of said isolation regions comprises an insulating film.

6. A semiconductor memory device in accordance with claim 4, wherein
each of said charge storage regions comprises an impurity diffusion layer, an isulating film formed on said impurity diffusion layer and a cell plate formed on said insulating film.

7. A semiconductor memory device, comprising:
a semiconductor substrate formed of a material of a first conductivity type and having a major surface;
a plurality of word lines arranged on said semiconductor substrate;
a plurality of bit lines arranged to intersect with said word lines;
an array of memory cells on said substrate at intersections of said word lines and said bit lines;
said major surface of said substrate having a cell trench formed among said memory cells and having isolation trenches formed integrally therein between memory cells of said array;
charge storage regions of said cells formed in the surface of said cell trench; and
isolating regions extending into the substrate, only portions of the bottom surfaces of said isolation trenches containing said isolating regions for electrically isolating charge storage layers or adjacent cells, including diagonally adjacent cells of the array, from each other.

8. The semiconductor memory device of claim 7, wherein said cell trench is formed in a staggered reticular pattern among said memory cells.

9. A semiconductor memory device in accordance with claim 7, wherein
said isolation region comprises an insulating film.

10. A semiconductor memory device in accordance with claim 7, wherein
each of said charge storage regions comprises an impurity diffusion layer, a cell plate, and an insulating film formed therebetween.

* * * * *